(12) United States Patent
Ninomiya

(10) Patent No.: US 6,639,275 B2
(45) Date of Patent: Oct. 28, 2003

(54) SEMICONDUCTOR DEVICE WITH VERTICAL MOSFET

(75) Inventor: Hitoshi Ninomiya, Tokyo (JP)

(73) Assignee: NEC Corporaiton, Tokyo (JP)

(*) Notice: Subject to any disclaimer, the term of this patent is extended or adjusted under 35 U.S.C. 154(b) by 0 days.

(21) Appl. No.: 10/164,640

(22) Filed: Jun. 10, 2002

(65) Prior Publication Data

US 2002/0187597 A1 Dec. 12, 2002

(30) Foreign Application Priority Data

Jun. 8, 2001 (JP) .......................................... 2001-174740

(51) Int. Cl.$^7$ ............................................ H01L 29/792
(52) U.S. Cl. ...................... 257/330; 257/331; 257/332; 257/333; 257/334; 438/268; 438/269; 438/270; 438/273; 438/274
(58) Field of Search ................................ 257/330–334; 438/268–274

(56) References Cited

U.S. PATENT DOCUMENTS 6,015,725 A * 1/2000 Hirayama .................... 438/156

* cited by examiner

*Primary Examiner*—D Le
(74) *Attorney, Agent, or Firm*—Sughrue Mion, PLLC

(57) ABSTRACT

A semiconductor device improves the gate withstand voltage of vertical MOSFETs and raises their operation speed. The gate electrode is formed in the trench of the second semiconductor layer. The interlayer dielectric layer has the contact hole that exposes the connection portion of the gate electrode, where the connection portion is located in the trench. The conductive plug is filled in the contact hole of the interlayer dielectric layer in such a way as to contact the connection portion of the gate electrode. The wiring layer is formed on the interlayer dielectric layer in such a way as to contact the plug, resulting in the wiring layer electrically connected to the connection portion by way of the plug. There is no need to form a connection portion for the gate electrode outside of the trench, which means that the gate dielectric does not include a weak or thinner portion where dielectric breakdown is likely to occur.

7 Claims, 8 Drawing Sheets

SEMICONDUCTOR DEVICE WITH VERTICAL MOSFET

BACKGROUND OF THE INVENTION

1. Field of the Invention

The present invention relates generally to semiconductor device. More particularly, the invention relates to a semiconductor device having a structure of a vertical Field-Effect Transistor (FET), such as a vertical Metal-Oxide-Semiconductor FET (MOSFET), and a method of fabricating the device.

2. Description of the Related Art

Typically, vertical MOSFET structures have been used for power MOSFETs and Insulated-Gate Bipolar Transistors (IGBTs). In particular, if the drain-to-source withstand voltage of power MOSFETs is approximately 10 V to 60 V, power MOSFETs with their gate electrodes in a trench or trenches have been becoming the mainstream.

FIG. 1A is a schematic, partial plan view of a prior-art semiconductor device of this type and FIG. 1B is a schematic, partial cross-sectional view along the line IB—IB in FIG. 1A.

The prior-art semiconductor device of FIGS. 1A and 1B comprises a $n^+$-type semiconductor substrate 111 on which a plurality of vertical MOSFETs 131 are formed. A $n^-$-type epitaxial layer 112 is formed on the substrate 111 to cover its whole surface. The layer 112 serves as the common drain region for the MOSFETs 131 along with the substrate 111.

In the surface area of the epitaxial layer 112, a field dielectric 118 is selectively formed to define approximately rectangular active regions 132 on the substrate 111. In each of the region 132s, a p-type diffusion layer 116 is formed in the surface area of the layer 112. A lattice-shaped trench 113 is formed in the epitaxial layer 116 to penetrate vertically through the same, thereby forming device-formation regions on the substrate 111. Thus, the diffusion layer 116 is divided into rectangular islands by the trench 113, where the islands are arranged at specific intervals over the entire substrate 111. Each of the islands constitutes a base region 116a. The trench 113 extends laterally toward the field dielectric 118. The ends 113a of the trench 113 are located near the isolation dielectric 118.

In the surface area of each base region 116a, $n^+$-type diffusion regions 117 are formed to serve as source regions. Each of the source regions 117 has a frame-like plan shape running along the periphery of the corresponding base region 116a at a specified width.

Gate electrodes 115, which are connected together, are formed in the trench 113 by way of corresponding gate dielectrics 114. The gate dielectrics 114, which are united together, cover the whole inner surface of the trench 113 and are located on the surface of the diffusion layer 116 outside the trench 113. The gate electrodes 115 fill almost all the trench 113 while the tops of the electrodes 115 are exposed from the trench 113.

A gate connection portion 115a having a specific pattern is formed to connect to the gate electrodes 115. The portion 115a is located outside the trench 113. Almost all the portion 115a is placed on the field dielectric 112.

An interlayer dielectric layer 122 is formed on the p-type diffusion layer 116 to cover the gate electrodes 115 and the $n^+$-type source regions 117. The layer 122 has contact holes 120 and a contact hole 121. The holes 120 are located over the respective base regions 116a to expose the corresponding base regions 116a and the corresponding source regions 117. The hole 121 is located over the field dielectric 118 to expose the gate connection portion 115a.

On the interlayer dielectric layer 122, a source wiring layer 123 and a gate wiring layer 124 are formed. The source wiring layer 123, which covers almost all the active region 132, is mechanically and electrically connected to the base regions 116a and the source regions 117 by way of the contact holes 120. The gate wiring layer 124, which extends along the edge of the active region 132 over the field dielectric 118, is mechanically and electrically connected to the gate connection portion 115a by way of the contact hole 121.

The common drain region (which is formed by the combination of the substrate 111 and the epitaxial layer 112), the source electrodes 117, the gate dielectrics 114, and the gate electrodes 115 constitute the vertical MOSFETs 131 connected in parallel on the substrate 111.

P-n junctions are formed at the interfaces of the epitaxial layer 112 and the base regions 116a (i.e., the diffusion layer 116) The layer 112 serves as an electric-field relaxation layer for relaxing the electric field applied to these p-n junctions, in addition to the function of the common drain region.

With the prior-art semiconductor device 100, as explained above, the gate connection portion 115a formed on the field dielectric 118 outside the trench 113 is connected to the gate wiring layer 124. This connection structure is based on the following reason.

Specifically, the gate electrodes 115 are formed by filling the trench 113 with a conductive material (e.g., n-type polysilicon) using a CVD (Chemical Vapor Deposition) method or the like. Thus, in order to suppress the required thickness of the conductive material for filling the trench 113, the width of the trench 113 needs to be as much as approximately 1.0 $\mu$m or less. Moreover, the width of the trench 113 needs to be approximately uniform over the whole length of the trench 113, Therefore, if the gate wiring layer 124 is directly connected to the gate electrodes 115, the size of the contact holes for electrically connecting the gate wiring layer 124 to the gate electrodes 115 will be as small as approximately 0.6 $\mu$m or less while taking the alignment margin in consideration. Since the gate wiring layer 124 is typically formed by sputtering or evaporating a metal such as aluminum (Al), the layer 124 will not be formed to fill such the small contact holes. This means that electrical connection of the layer 124 to the gate electrodes 115 is not realized. For this reason, the gate connection portion 115a is additionally provided outside the trench 113 for this purpose.

The prior-art device 100 has the following problem, because the gate connection portion 115a is located over the ends 113a of the trench 113

As shown in FIG. 1B, the p-type diffusion layer 116 has approximately right-angled top corners 116b at the ends 113a of the trench 113. Thus, the thickness of the gate dielectric 114 near the top corners 116b will be thinner than that on other flat surfaces such as the bottom faces of the trench 113. Furthermore, with the vertical MOSFET of this type, the gate dielectrics 14 are typically formed by a thin silicon dioxide ($SiO_2$) layer with a thickness of approximately 10 to 100 nm generated by thermal oxidation.

Accordingly, if a voltage is applied across the p-type diffusion layer 116 and the gate connection portion 115a, dielectric breakdown of the gate dielectric 114 is likely to occur near the top corners 116b of the layer 116. Thus, a problem that the gate withstand voltage of the MOSFET 131 is insufficient will arise.

This problem can be solved to some extent if a proper heat treatment such as wet oxidation at 1100° C. or higher is applied. This is because the corners 116b of the diffusion layer 116 are rounded due to high-temperature wet oxidation. However, high-temperature treatment will cause another problem that high-speed operation of the MOSFET 131 is difficult to be realized as desired. The reason of this problem is that high-temperature treatment makes it difficult for the MOSFET 131 to have a shallow structure, thereby restraining the reduction of the parasitic capacitance.

SUMMARY OF THE INVENTION

Accordingly, an object of the present invention is to provide a semiconductor device that raises or improves the gate withstand voltage of a vertical FET, and a method of fabricating the device.

Another object of the present invention is to provide a semiconductor device that makes it possible to raise the operation speed of a vertical FET, and a method of fabricating the device.

The above objects together with others not specifically mentioned will become clear to those skilled in the art from the following description.

According to a first aspect of the invention, a semiconductor device is provided, which comprises:
(a) a semiconductor substrate;
(b) a first semiconductor layer of a first conductivity type formed on the substrate,
  the first semiconductor layer serving as a first source/drain region;
(c) a second semiconductor layer of a second conductivity type formed on the first semiconductor layer;
  the second semiconductor layer having a trench penetrating the same;
(d) a gate electrode formed in the trench by way of a gate dielectric;
  the gate electrode having a connection portion located in the trench;
(e) a second source/drain region of the first conductivity type formed in a surface area of the second semiconductor layer;
(f) an interlayer dielectric layer formed on the second semiconductor layer to cover the gate electrode;
  the interlayer dielectric layer having a contact hole that exposes the connection portion of the gate electrode;
(g) a conductive plug filled in the contact hole in such a way as to contact the connection portion of the gate electrode; and
(h) a wiring layer formed on the interlayer dielectric layer in such a way as to contact the plug;
  the wiring layer being electrically connected to the connection portion of the gate electrode by way of the plug.

With the semiconductor device according to the first aspect of the invention, the gate electrode is formed in the trench of the second semiconductor layer. The interlayer dielectric layer has the contact hole that exposes the connection portion of the gate electrode, where the connection portion is located in the trench. The conductive plug is filled in the contact hole of the interlayer dielectric layer in such a way as to contact the connection portion of the gate electrode. The wiring layer is formed on the interlayer dielectric layer in such a way as to contact the plug, resulting in the wiring layer being electrically connected to the connection portion of the gate electrode by way of the plug.

Accordingly, unlike the previously-explained prior-art semiconductor device 100 of FIGS. 1A and 1B, there is no need to form a connection portion for the gate electrode outside the trench. This means that the gate dielectric does not include a weak or thinner portion where dielectric breakdown is likely to occur. As a result, dielectric breakdown of the gate dielectric is prevented or effectively suppressed, which improves or raises the gate withstand voltage of a vertical FET.

Moreover, unlike the prior-art device 100 of FIGS. 1A and 1B, there is no need to conduct high-temperature treatment for the purpose of raising the gate withstand voltage of a vertical FET. Therefore, vertical FET can be easily formed to have a shallow structure, which means that the parasitic capacitance is effectively reduced as desired. As a result, the operation speed of a vertical FET can be raised.

In a preferred embodiment of the device according to the first aspect, an active region is formed or defined on the substrate. The second source/drain region is located in the active region. The wiring layer is located to overlap with a periphery of the active region.

In another preferred embodiment of the device according to the first aspect, the trench is formed to have a lattice-like shape. The second semiconductor layer is divided into parts by the trench. The parts of the second semiconductor layer are used to form a plurality of vertical FETs on the substrate.

According to a second aspect of the invention, another semiconductor device is provided, which comprises:
(a) a semiconductor substrate;
(b) a first semiconductor layer of a first conductivity type formed on the substrate;
  the first semiconductor layer serving as a first source/drain region;
(c) a second semiconductor layer of a second conductivity type formed on the first semiconductor layer;
  the second semiconductor layer having a trench penetrating the same;
(d) a gate electrode formed in the trench by way of a gate dielectric;
  the gate electrode having a connection portion located in the trench;
(e) a second source/drain region of the first conductivity type formed in a surface area of the second semiconductor layer;
(f) an interlayer dielectric layer formed on the second semiconductor layer to cover the second source/drain region and the gate electrode;
  the interlayer dielectric layer having a first contact hole that exposes the connection portion of the gate electrode and a second contact hole that exposes the second source/drain region;
(g) a first conductive plug filled in the first contact hole in such a way as to contact the connection portion of the gate electrode;
(h) a second conductive plug filled in the second contact hole in such a way as to contact the second source/drain region;
(i) a first wiring layer formed on the interlayer dielectric layer in such a way as to contact the first plug;
  the first wiring layer being electrically connected to the connection portion of the gate electrode by way of the first plug; and
(j) a second wiring layer formed on the interlayer dielectric layer in such a way as to contact the second plug;
  the second wiring layer being electrically connected to the source region by way of the second plug.

With the semiconductor device according to the second aspect of the invention, the gate electrode is formed in the trench of the second semiconductor layer. The interlayer dielectric layer has the first contact hole that exposes the connection portion of the gate electrode and the second contact hole that exposes the second source/drain region, where the connection portion is located in the trench. The first conductive plug is filled in the first contact hole in such a way as to contact the connection portion of the gate electrode. The second conductive plug is filled in the second contact hole in such a way as to contact the second source/drain region. The first wiring layer is formed on the interlayer dielectric layer in such a way as to contact the first plug, resulting in the first wiring layer being electrically connected to the connection portion of the gate electrode by way of the first plug. The second wiring layer is formed on the interlayer dielectric layer in such a way as to contact the second plug, resulting in the second wiring layer being electrically connected to the source region by way of the second plug, Accordingly, like the device according to the first aspect, there is no need to form a connection portion for the gate electrode outside of the trench. This means that the gate dielectric does not include a weak or thinner portion where dielectric breakdown is likely to occur. As a result, dielectric breakdown of the gate dielectric is prevented or effectively suppressed, which improves the gate withstand voltage of a vertical FET.

Moreover, like the device according to the first aspect, there is no need to conduct high-temperature treatment for the purpose of raising the gate withstand voltage of a vertical FET. Therefore, a vertical FET can be easily formed to have a shallow structure. This means that the parasitic capacitance is effectively reduced as desired. As a result, the operation speed of a vertical FET can be raised.

In addition, with the previously-explained prior-art semiconductor device 100 of FIGS. 1A and 1B, to electrically connect the source wiring layer to the source region, the source wiring layer needs to fill a corresponding contact hole. Thus, the contact hole for the source wiring layer is difficult to be miniaturized, which results in a problem that miniaturization of a vertical FET is difficult.

On the other hand, with the semiconductor device of the second aspect, the second wiring layer (e.g., the source wiring layer) is electrically connected to the second source/drain region by way of the second conductive plug. Thus, the second contact hole for the source wiring layer can be miniaturized, which results in miniaturization of a vertical FET.

In a preferred embodiment of the device according to the second aspect, an active region is formed on the substrate. The second source/drain region is located in the active region. The first wiring layer is located to overlap with a periphery of the active region.

In another preferred embodiment of the device according to the second aspect, the trench is formed to have a lattice-like shape. The second semiconductor layer is divided into parts by the trench. The parts of the second semiconductor layer are used to form a plurality of vertical FETs on the substrate.

In still another preferred embodiment of the device according to the second aspect, each of the first contact hole and the second contact hole has a size approximately equal to a width of the trench. There is an additional advantage that both of the first and second contact holes can be designed according to the same design rule.

According to a third aspect of the invention, a method of fabricating the semiconductor device according to the first aspect is provided. This method comprises:
(a) forming a first semiconductor layer of a first conductivity type on a semiconductor substrate;

the first semiconductor layer serving as a first source/drain region;
(b) forming a second semiconductor layer of a second conductivity type on the first semiconductor layer;
(c) forming a trench in the second semiconductor layer in such a way that the trench penetrates the second semiconductor layer;
(d) forming a gate electrode in the trench by way of a gate dielectric;
the gate electrode having a connection portion located in the trench;
(e) forming a second source/drain region of the first conductivity type in a surface area of the second semiconductor layer;
(f) forming an interlayer dielectric layer on the second semiconductor layer to cover the gate electrode;
(g) selectively removing the interlayer dielectric layer to form a contact hole that exposes the connection portion of the gate electrode;
(h) forming a conductive plug to fill the contact hole in such a way as to contact the connection portion of the gate electrode; and
(i) forming a wiring layer on the interlayer dielectric layer in such a way as to contact the plug;
the wiring layer being electrically connected to the connection portion of the gate electrode by way of the plug.

With the method according to the third aspect, it is obvious that the semiconductor device of the first aspect is fabricated.

In a preferred embodiment of the method according to the third aspect, a step of forming an active region on the substrate is additionally provided. The second source/drain region is located in the active region. The wiring layer is located to overlap with a periphery of the active region.

In another preferred embodiment of the method according to the third aspect, the trench is formed to have a lattice-like shape in the step (c). The second semiconductor layer is divided into parts by the trench. The parts of the second semiconductor layer are used to form a plurality of vertical FETs on the substrate.

According to a fourth aspect of the invention, a method of fabricating the semiconductor device according to the second aspect is provided. This method comprises:
(a) forming a first semiconductor layer of a first conductivity type on a semiconductor substrate;
the first semiconductor layer serving as a first source/drain region;
(b) forming a second semiconductor layer of a second conductivity type on the first semiconductor layer;
(c) forming a trench in the second semiconductor layer in such a way that the trench penetrates the second semiconductor layer;
(d) forming a gate electrode in the trench by way of a gate dielectric;
the gate electrode having a connection portion located in the trench;
(e) forming a second source/drain region of the first conductivity type in a surface area of the second semiconductor layer;
(f) forming an interlayer dielectric layer on the second semiconductor layer to cover the gate electrode;
(g) selectively removing the interlayer dielectric layer to form a first contact hole that exposes the connection portion of the gate electrode and a second contact hole that exposes the second source/drain region;
(h) forming a first conductive plug to fill the first contact hole in such a way as to contact the connection portion of the gate electrode and a second conductive plug to fill the second contact hole in such a way as to contact the second source/drain region; and (i) forming a first wiring layer and a second wiring layer on the interlayer dielectric layer in such a way as to contact the first plug and the second plug, respectively;

the first wiring layer being electrically connected to the connection portion of the gate electrode by way of the first plug;

the second wiring layer being electrically connected to the second source/drain region by way of the second plug.

With the method according to the fourth aspect, it is obvious that the semiconductor device of the second aspect is fabricated.

In a preferred embodiment of the method according to the fourth aspect, a step of forming an active region on the substrate is additionally provided. The second source/drain is located in the active region. The wiring layer is located to overlap with a periphery of the active region.

In another preferred embodiment of the method according to the fourth aspect, the trench is formed to have a lattice-like shape in the step (c). The second semiconductor layer is divided into parts by the trench. The parts of the second semiconductor layer are used to form a plurality of vertical FETs on the substrate.

In still another preferred embodiment of the method according to the fourth aspect, each of the first contact hole and the second contact hole is formed to have a size approximately equal to a width of the trench in the step (g). There is an additional advantage that both of the first and second contact holes can be designed according to the same design rule.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMETNS

Figure 1A:
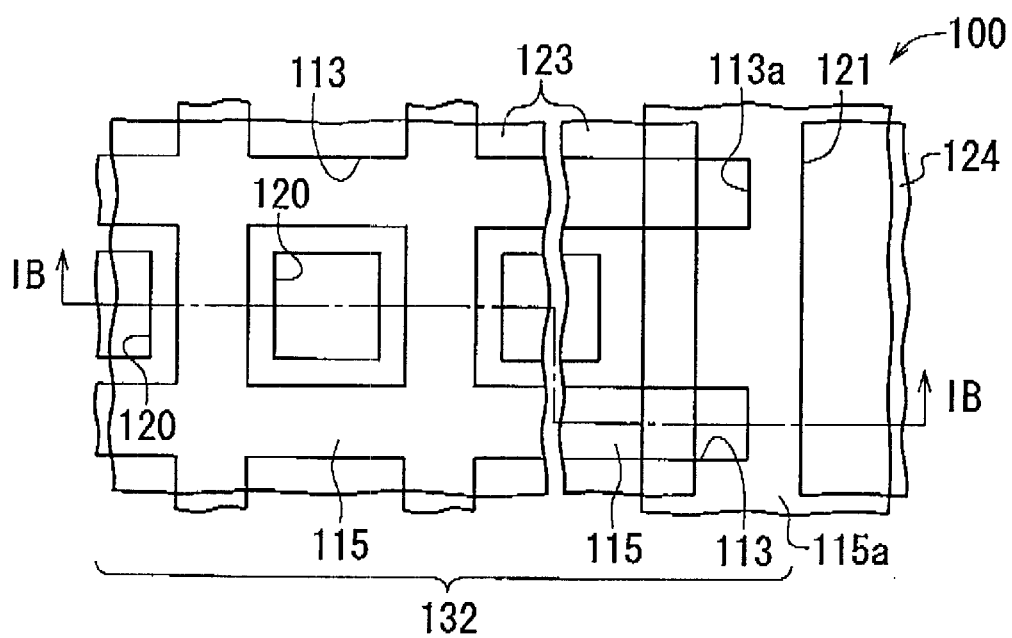
FIG. 1A is a partial plan view showing the layout of a prior-art semiconductor device with vertical MOSFETs.

Preferred embodiments of the present invention will be described in detail below while referring to the drawings attached.

First Embodiment

Figure 2A:
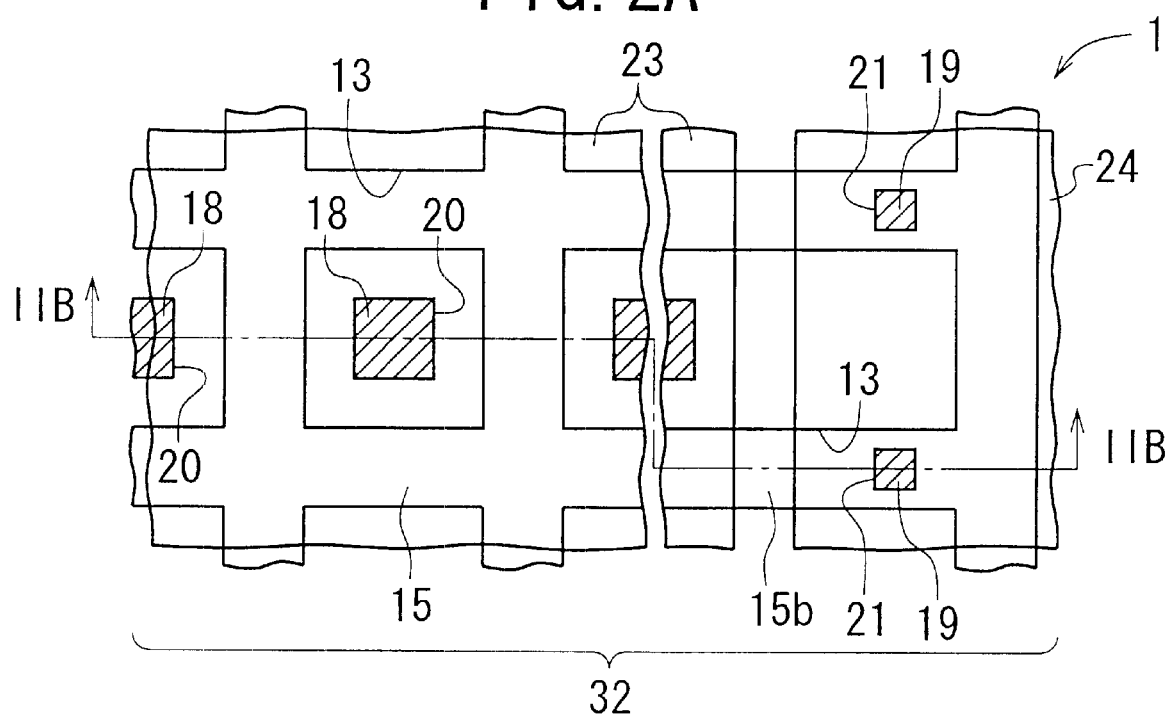
FIG. 2A is a partial plan view showing the layout of a semiconductor device with vertical MOSFETs according to a first embodiment of the invention.
Figure 2B:
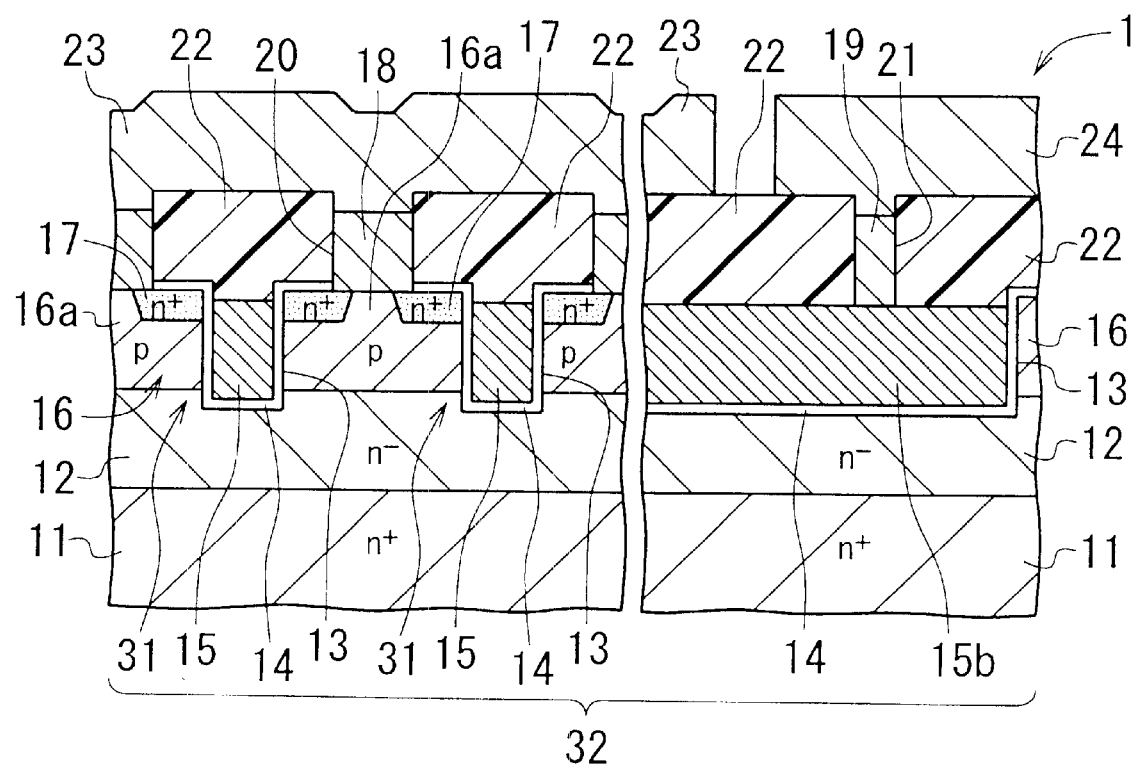
FIG. 2B is a partial, cross-sectional view along the line IIB—IIB in FIG. 2A, which shows the structure of the device of FIG. 2A.

FIGS. 2A and 2B show the structure of a semiconductor device with vertical MOSFETs according to a first embodiment of the invention, respectively.

The semiconductor device 1 of FIGS. 2A and 2B comprises a $n^+$-type semiconductor substrate 11 on which a plurality of vertical MOSFETs 31 are formed. The substrate 11 is made of a popular semiconductor material, such as silicon (Si). A $n^-$-type epitaxial layer 12 is formed on the substrate 11 to cover its whole surface. The layer 12 serves as the common drain region for the MOSFETs 31 along with the substrate 11.

On the surface of the epitaxial layer 12, a field dielectric (not shown) is selectively formed to define approximately rectangular active regions 32 on the substrate 11. In each of the regions 32, a p-type diffusion layer 16 is formed in the surface area of the layer 12. A lattice-shaped trench 13 is formed in the epitaxial layer 16 to penetrate vertically through the same, thereby forming device-formation regions on the substrate 11. Thus, the diffusion layer 16 is divided into rectangular islands by the trench 13, where the islands are arranged at specific intervals over the substrate 11. Each of the islands constitutes a base region 16a. The trench 13 extends laterally toward the field dielectric (not shown) (i.e., the edge of the region 32). The ends of the trench 13 are located near the isolation dielectric.

In the surface area of each base region 16a, a $n^+$-type diffusion region 17 is formed to serve as a source region. The source region 17 has a frame-like plan shape running along the periphery of the corresponding base region 16a at a specified width.

Gate electrodes 15, which are connected together, are formed in the trench 13 by way of corresponding gate dielectrics 14. The electrodes 15 are made of a conductive material such as n-type polysilicon. The gate dielectrics 14, which are united together, cover the whole inner surface of the trench 13 and are located on the surfaces of the diffusion regions 16 outside the trench 13. The gate electrodes 15 fill almost all the trench 13 while the tops of the electrodes 15 are exposed from the trench 13.

A gate connection portion 15b having a specific pattern is formed to connect to the gate electrodes 15. In other words, an end part of the electrodes 15 serves as the connection portion 15b. Unlike the connection portion 115a of the prior-art device of FIGS. 1A and 1B, the portion 15b is entirely located in the trench 13.

An interlayer dielectric layer 22 is formed on the p-type diffusion layer 16 to cover the gate electrodes 15 and the $n^+$-type source regions 17 over the whole substrate 11. The layer 22 has contact holes 20 and contact holes 21.

The holes 20 are located right over the respective base regions 16a to expose the corresponding base regions 16a and the corresponding source regions 17. Conductive plugs 18, which are made of a conductive material such as tungsten (W), are filled in the corresponding holes 20. The plugs 18 have the same square plan shape. The widths of the plugs 18 are approximately the same as the width (i.e., the inner dimension) of the trench 13.

The holes 21 are located right over the connection portion 15b of the gate electrodes 15 in the periphery of the active region 32. The holes 21 are arranged along the edge of the region 32 (i.e., the p-type diffusion layer 16). The connection portion 15b of the gate electrodes 15 is exposed from the holes 21. Conductive plugs 19, which are made of the same conductive material as the plugs 18, are filled in the corresponding holes 21. The plugs 19 have the same square plan shape. The widths of the plugs 19 are smaller than the width (i.e., the inner dimension) of the trench 13.

On the interlayer dielectric layer 22, a source wiring layer 23 and a gate wiring layer 24 are formed. The source wiring layer 23, which covers almost all the active region 32 (i.e., the p-type diffusion layer 16), is mechanically and electrically connected to the base regions 16a and the source regions 17 by way of the contact plugs 18. The gate wiring layer 24, which covers the contact holes 21 and which extends along the edge of the active region 32 (i.e., the p-type diffusion layer 16) over the field dielectric, is mechanically and electrically connected to the gate connection portion 15b by way of the contact plugs 19.

The common drain region (which is formed by the combination of the substrate 11 and the epitaxial layer 12), the source regions 17, the gate dielectrics 14, and the gate electrodes 15 constitute the vertical MOSFETs 31 connected in parallel on the substrate 11.

P-n junctions are formed at the interfaces of the epitaxial layer 12 and the base regions 16a (i.e., the diffusion layer 16). The layer 12 serves as an electric-field relaxation layer for relaxing the electric field applied to these p-n junctions, in addition to the function of the common drain region.

Next, a method of fabricating the semiconductor device 1 of the first embodiment is explained below with reference to FIGS. 3A to 6A and FIGS. 3B to 6B.

Figure 3A:
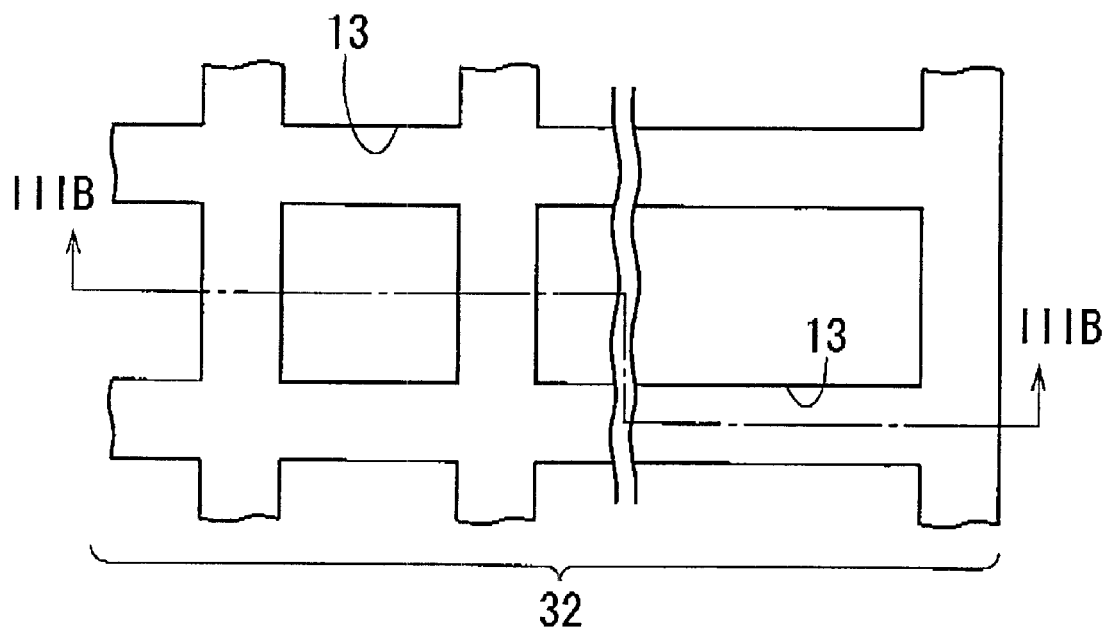
FIG. 3A is a partial plan view showing the process steps of a method of fabricating the semiconductor device according to the first embodiment of FIGS. 1A and 1B.
Figure 3B:
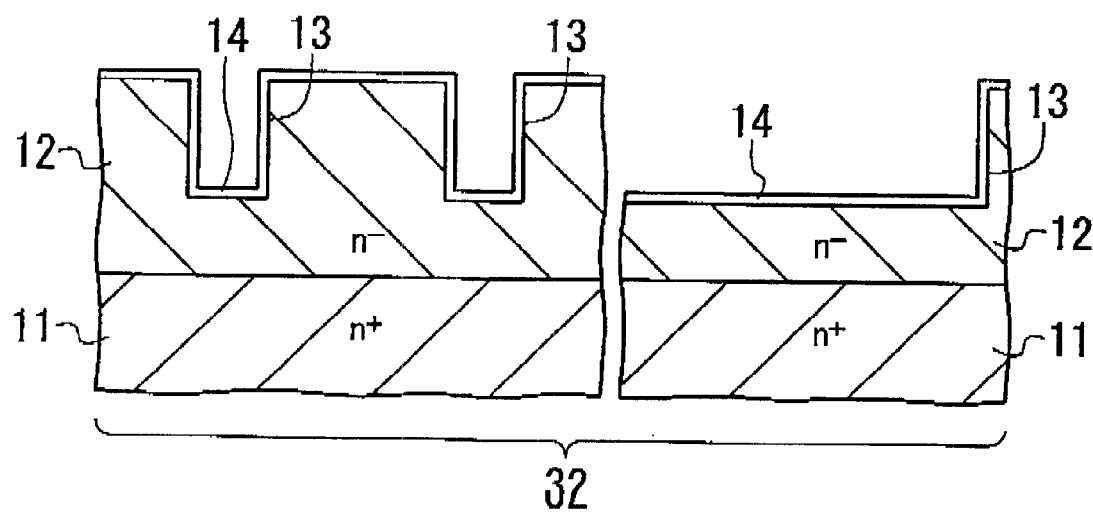
FIG. 3B is a partial, cross-sectional view along the line IIIB—IIIB in FIG. 3A, which is the same as the line IIB—IIB in FIG. 2A.

First, as shown in FIGS. 3A and 3B, the $n^-$-type epitaxial layer 12 is grown on the whole surface of the $n^+$-type substrate 11 by a known method. As the substrate 11, for example, a $n^-$-type single-crystal Si substrate with the dopant concentration of approximately $1 \times 10^{19}$ cm$^{-3}$ may be used. The dopant concentration of the epitaxial layer 12 is, for example, approximately $4 \times 10^{15}$ cm$^{-3}$.

Subsequently, the field dielectric (not shown) is selectively formed on the epitaxial layer 12 by the so-called LOCOS (LOcal Oxidation of Silicon) method. The field dielectric thus formed defines the active region 32 on the substrate 11.

Thereafter, using the known photolithography technique and the RIE (Reactive Ion Etching) method, the epitaxial layer 12 is selectively removed to form the lattice-shaped trench 13 in such a way that the trench 13 does not penetrate through the same layer 12. The depth and width of the trench 13 are approximately 1.0 □m and approximately 0.7 □m, respectively.

Following this step, the gate dielectrics 14 are formed on the surface of the epitaxial layer 12 and the inner surfaces of the trench 13 by a known method. For example, the surface of the epitaxial layer 12 is thermally oxidized in an $H_2$—$O_2$ atmosphere (i.e., in the gaseous mixture of $H_2$ and $O_2$) at 900° C., thereby forming the gate dielectrics 14 with a thickness of approximately 30 nm. The state at this stage is shown in FIGS. 3A and 3B.

A polysilicon layer (not shown) is deposited on the whole surface of the substrate 11 by the reduced-pressure CVD method. The thickness of the polysilicon layer is chosen in such a way that the polysilicon layer fills entirely the trench 13. For example, the thickness of the polysilicon layer is set at approximately 800 nm.

Figure 4A:
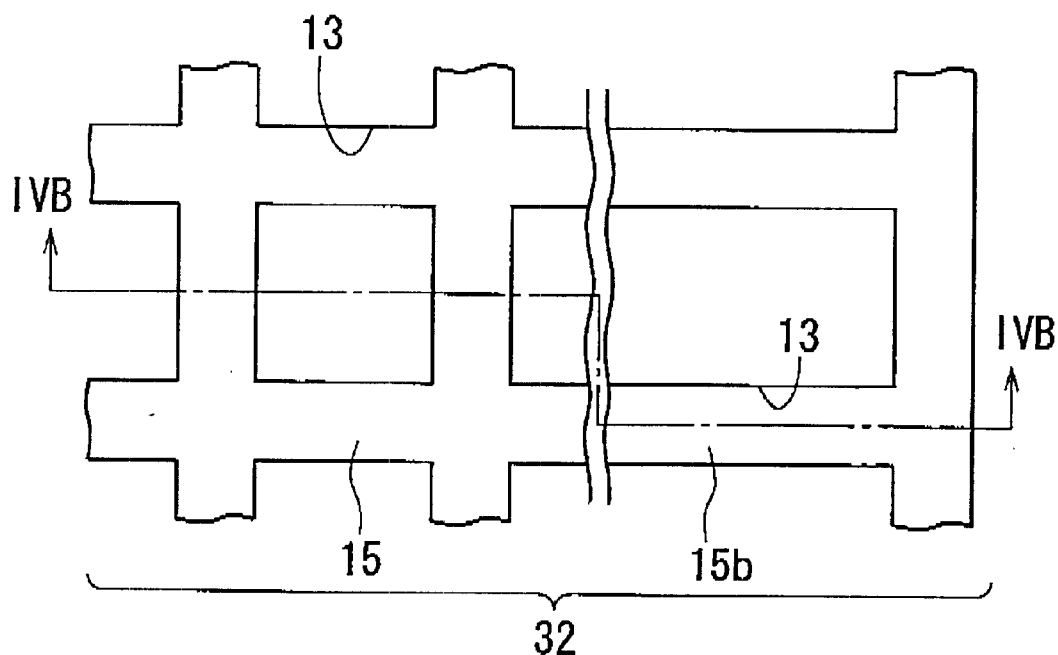
FIG. 4A is a partial plan view showing the process steps of the method of fabricating the semiconductor device according to the first embodiment of FIGS. 1A and 1B, which is subsequent to the step of FIG. 3A.
Figure 4B:
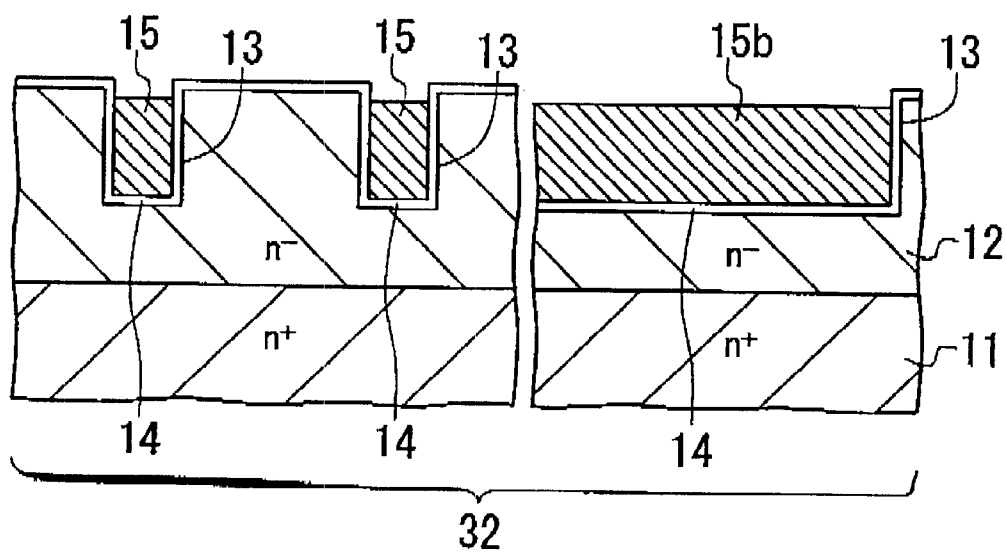
FIG. 4B is a partial, cross-sectional view along the line IVB—IVB in FIG. 4A, which is the same as the line IIB—IIB in FIG. 2A.

A n-type dopant is then introduced into the polysilicon layer thus deposited. For example, phosphorus (P) as the n-type dopant is thermally diffused into the polysilicon layer in a $PCl_3$ atmosphere at 920° C. Thereafter, the n-type polysilicon layer thus formed is selectively etched back by the RIE method to remove its unnecessary portions, thereby leaving selectively the n-type polysilicon layer in the trench 13. In this way, the gate electrodes 15 and its connection portion 15b are formed in the trench 13, as shown in FIGS. 4A and 4B.

Instead of the polysilicon layer, a polycide structure including a polysilicon layer and a silicide layer stacked to each other may be used for this purpose.

Figure 5A:
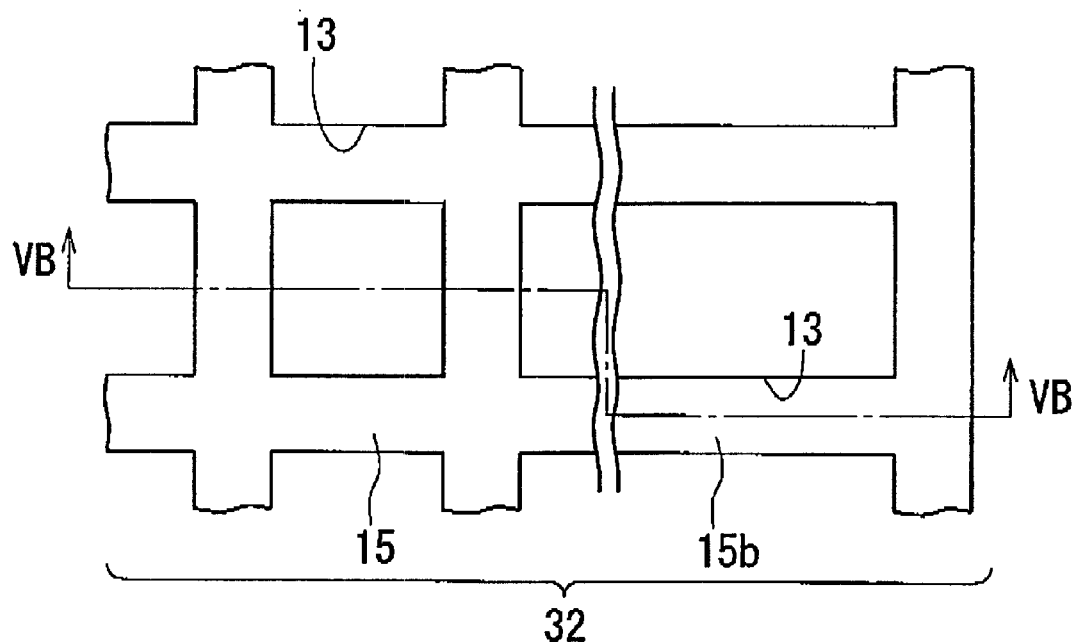
FIG. 5A is a partial plan view showing the process steps of the method of fabricating the semiconductor device according to the first embodiment of FIGS. 1A and 1B, which is subsequent to the step of FIG. 4A.
Figure 5B:
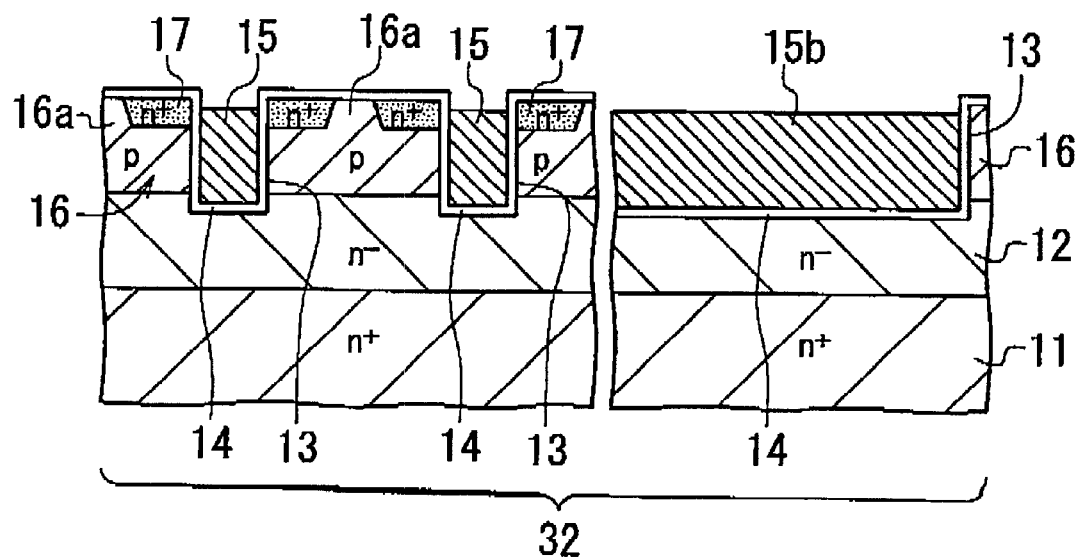
FIG. 5B is a partial, cross-sectional view along the line VB—VB in FIG. 5A, which is the same as the line IIB—IIB in FIG. 2A.

Furthermore, a p-type dopant such as boron (B) is selectively introduced into the n-type epitaxial layer 12 by the ion-implantation method and then, the layer 12 is subjected to a heat treatment for annealing. Thus, the p-type diffusion layer 16 is formed in the surface area of the epitaxial layer 12 in the active region 32, as shown in FIGS. 5A and 5B. The ion-implantation condition for boron is that, for example, the dose is 2 □1013 cm−2 and the acceleration energy is 70 keV. The heat treatment is carried out, for example, in a N2 atmosphere at 1100 □C for 60 minutes. The p-type diffusion layer 16 thus formed is divided into rectangular parts or islands arranged at specified intervals with the trench 13. The islands of the layer 16 form the respective base regions 16a.

A patterned mask (not shown) is formed on the p-type diffusion layer 16 by the known lithography technique. Then, a n-type dopant such as arsenic (As) is selectively introduced into the p-type diffusion layer 16. The layer 16 is then subjected to a heat treatment for annealing. Thus, the $n^+$-type diffusion regions or source regions 17 are formed in the surface area of the layer 16, as shown in FIGS. 5A and 5B. The ion-implantation condition for arsenic is that, for example, the dose is $1 \times 10^{16}$ cm$^{-2}$ and the acceleration energy is 70 keV. The heat treatment is carried out, for example, in a $N_2$ atmosphere at 1000° C. for 30 minutes.

Figure 6A:
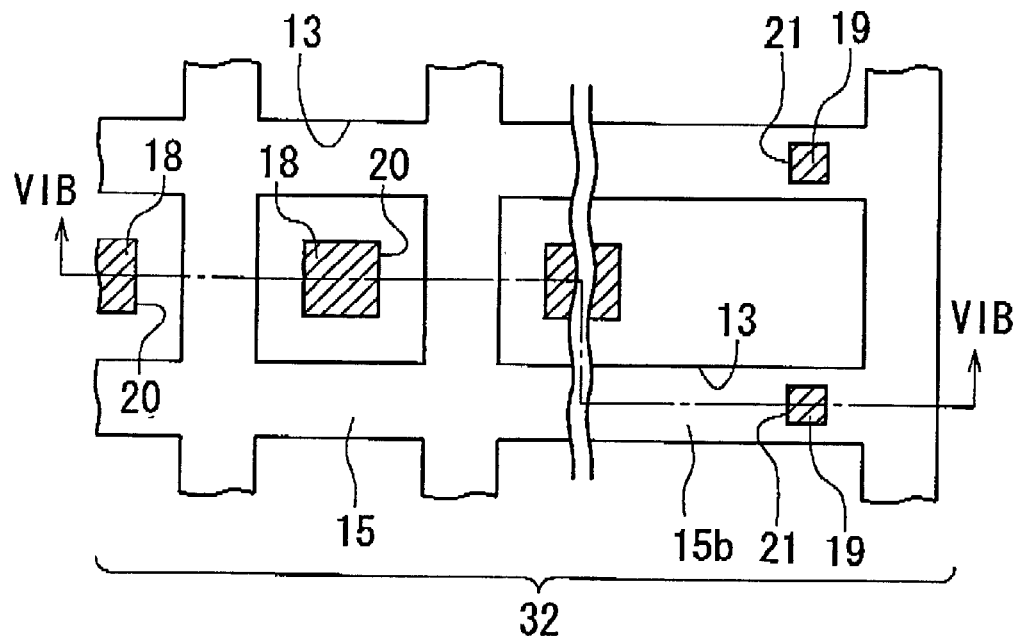
FIG. 6A is a partial plan view showing the process steps of the method of fabricating the semiconductor device according to the first embodiment of FIGS. 1A and 1B, which is subsequent to the step of FIG. 5A.
Figure 6B:
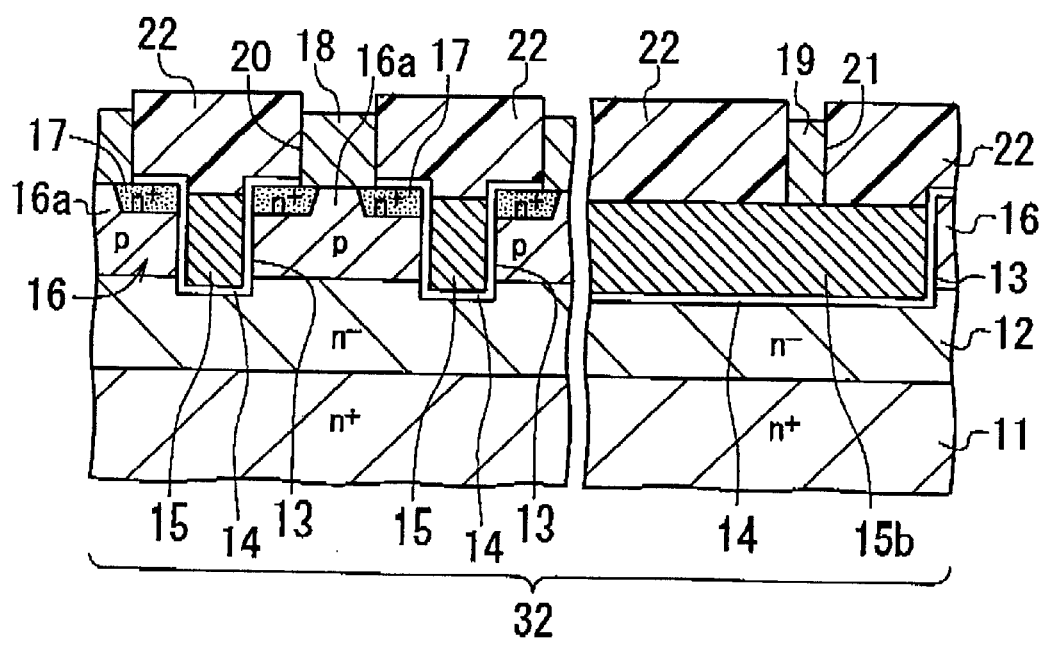
FIG. 6B is a partial, cross-sectional view along the line VIB—VIB in FIG. 6A, which is the same as the line IIB—IIB in FIG. 2A.

Thereafter, as shown in FIGS. 6A and 6B, a BPSG (Boron-doped PhosphorSilicate Glass) layer is deposited by the atmospheric-pressure CVD method over the whole substrate 11 as the interlayer dielectric layer 22. The thickness of the BPSG layer 22 is, for example, approximately 800 nm. Using the photolithography technique and the RIE method, the layer 22 is selectively removed to form the penetrating contact holes 20 and 21. The holes 20 are located right over the respective base regions 16a. The holes 21 are located right over the connection portion 15b of the gate electrodes 15 and arranged along the edge of the active region 32 (i.e., the p-type diffusion layer 16).

By the reduced-pressure CVD method, a tungsten (W) layer (not shown) is then deposited over the whole substrate 11. The thickness of the tungsten layer is determined in such a way that the tungsten layer fills entirely the contact holes 20 and 21. The thickness of the tungsten layer is set at, for example, approximately 800 nm.

The tungsten layer thus deposited is then etched back by the RIE method to remove selectively its unnecessary parts, thereby leaving the tungsten layer only in the contact holes 20 and 21. In this way, the conductive plugs 18 are formed in the holes 20 and the conductive plugs 19 are formed in the holes 21, as shown in FIGS. 6A and 6B.

Aluminum containing silicon (Si) at 1% is deposited over the whole substrate 11 by the sputtering method, thereby forming a conductive metal layer. The thickness of the conductive metal layer thus formed is, for example, 4000 nm. Thereafter, the metal layer thus formed is patterned by the photolithography and etching techniques, thereby forming the source wiring layer 23 and the gate wiring layer 24. In this way, the semiconductor device 1 of the first embodiment shown in FIGS. 2A and 2B is fabricated.

With the semiconductor device 1 according to the first embodiment of the invention, the gate electrodes 15 are formed in the trench 13 of the p-type diffusion layer 16. The interlayer dielectric layer 22 has the contact holes 20 that expose the base regions 16a and the source regions 17 and contact holes 21 that expose the connection portion 15b of the gate electrodes 15. The connection portion 15b is located in the trench 13. The conductive plugs 19 are filled in the contact holes 21 of the interlayer dielectric layer 22 in such a way as to contact the connection portion 15b of the gate electrodes 15. The source wiring layer 23 is formed on the interlayer dielectric layer 22 in such a way as to contact the plugs 18. The gate wiring layer 24 is formed on the interlayer dielectric layer 22 in such a way as to contact the plugs 19. 18. The gate wiring layer 24 is formed on the interlayer dielectric layer 22 in such a way as to contact the plugs 19.

Thus, the source wiring layer 23 is electrically connected to the source regions 17 and the base regions 16a by way of the plugs 18 and at the same time, the gate wiring layer 24 is electrically connected to the connection portion 15b of the gate electrodes 15 by way of the plugs 19.

Figure 1B:
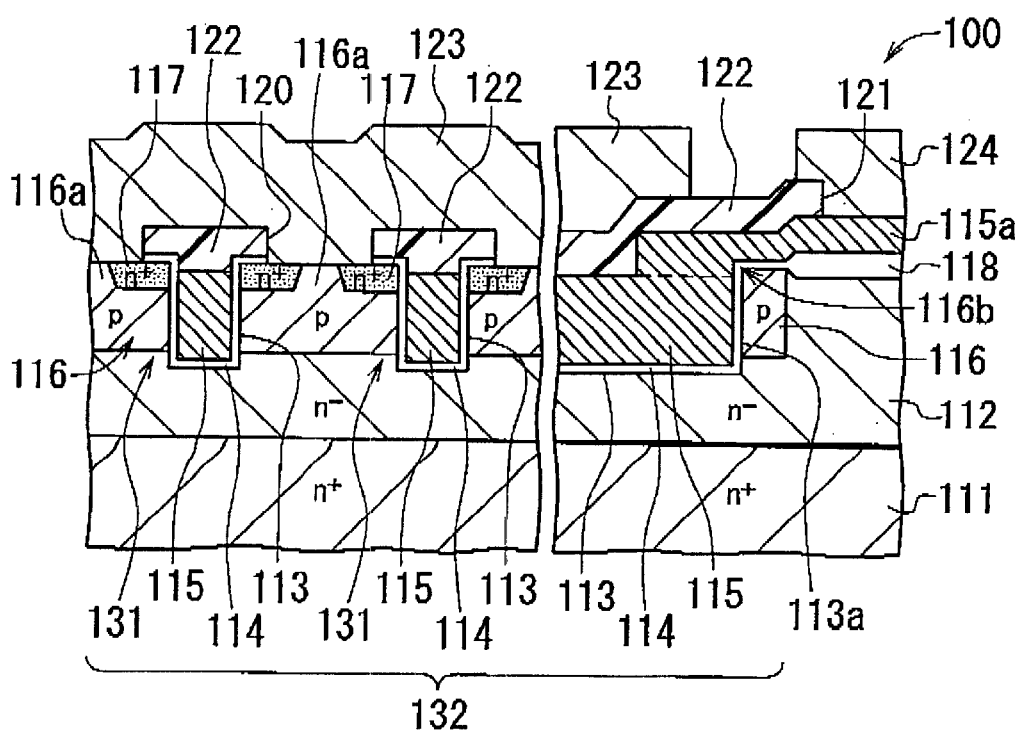
FIG. 1B is a partial, cross-sectional view along the line IB—IB in FIG. 1A, which shows the structure of the prior-art device of FIG. 1A.

Accordingly, unlike the previously-explained prior-art semiconductor device 100 of FIGS. 1A and 1B, there is no need to form a connection portion for the gate electrodes 15 outside the trench 13. This means that the gate dielectric 14 does not include a weak or thinner portion where dielectric breakdown is likely to occur. As a result, dielectric breakdown of the gate dielectric 13 is prevented or effectively suppressed, which improves the gate withstand voltage of the vertical MOSFETs 31.

Moreover, unlike the previously-explained prior-art device 100 of FIGS. 1A and 1B, there is no need to conduct high-temperature treatment for the purpose of raising the gate withstand voltage of the MOSFETs 31. Therefore, the vertical MOSFETs 31 can be easily formed to have a shallow structure. This means that the parasitic capacitance is effectively reduced as desired. As a result, the operation speed of the MOSFETs 31 can be raised.

Furthermore, since the contact holes 20 are filled with the corresponding conductive plugs 18, the size of the holes 20 can be reduced compared with the contact holes 120 of the prior-art device 100. This is applicable to the holes 21 into which the plugs 19 are filled. As a result, the vertical MOSFETs 31 can be easily reduced in size.

Second Embodiment

Figure 7A:
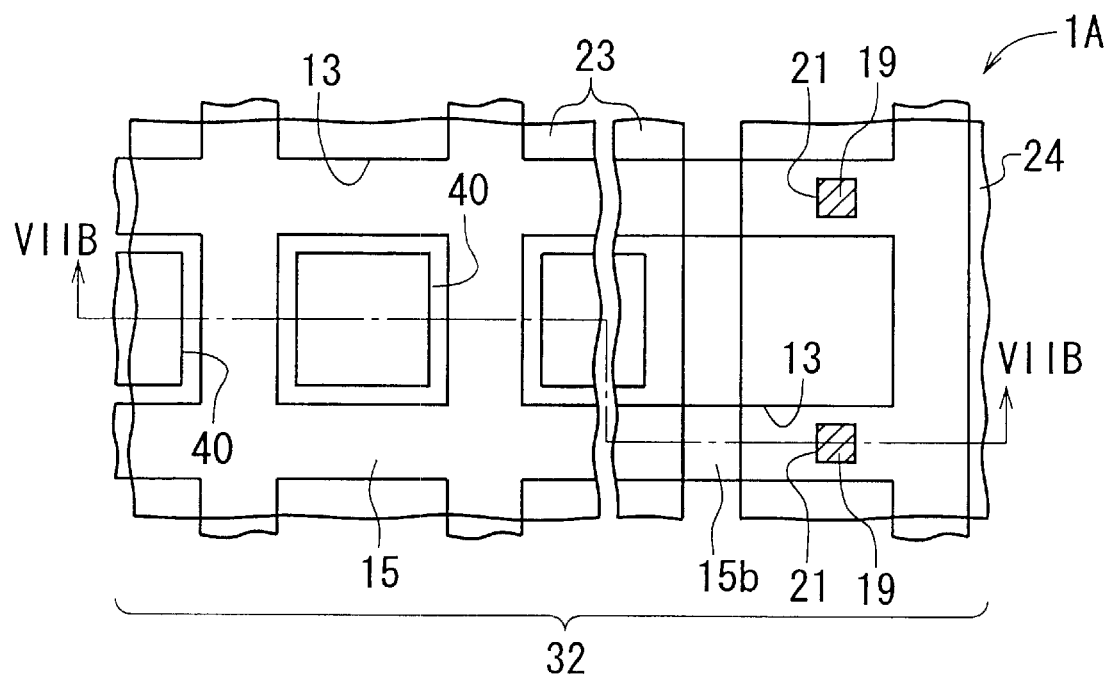
FIG. 7A is a partial plan view showing the layout of a semiconductor device with vertical MOSFETs according to a second embodiment of the invention.
Figure 7B:
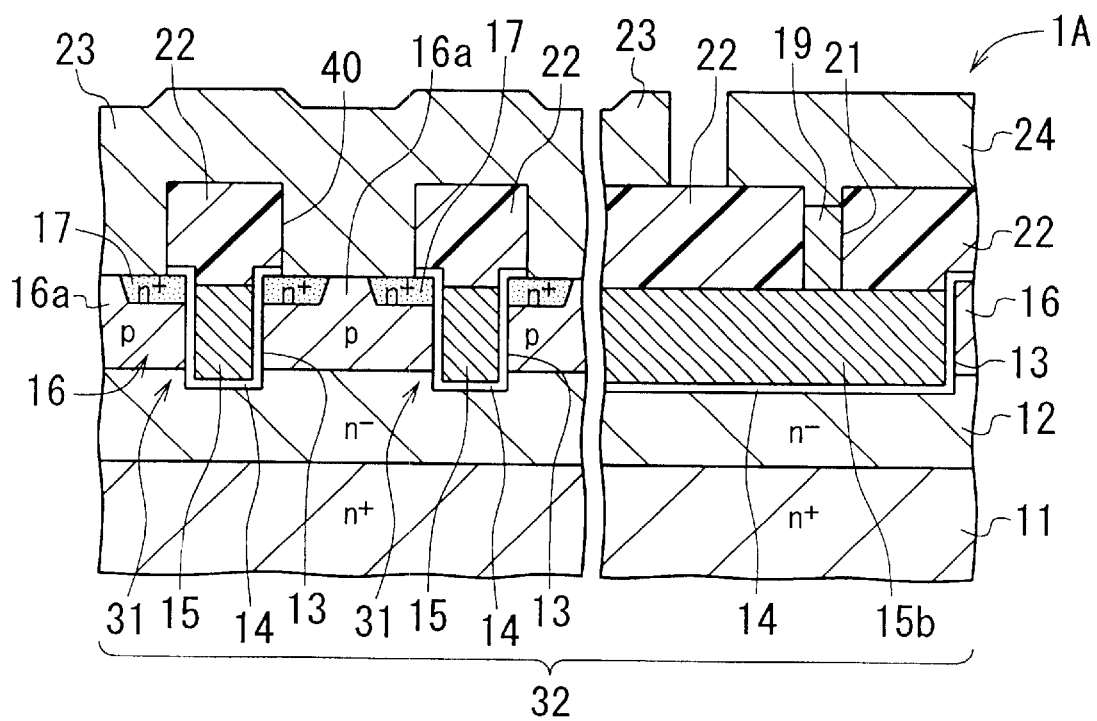
FIG. 7B is a partial, cross-sectional view along the line VIIB—VIIB in FIG. 7A, which shows the structure of the device of FIG. 7A.

FIGS. 7A and 7B show the structure of a semiconductor device 1A with vertical MOSFETs 31 according to a second embodiment of the invention, respectively.

The semiconductor device 1A of FIGS. 7A and 7B has the same configuration as the semiconductor device 1 of the first embodiment, except that contact holes 40 larger than the contact holes 20 are formed, and that the holes 40 are not filled with their conductive plugs. Therefore, the explanation about the same configuration is omitted here for the sake of simplification by attaching the same reference symbols as used in the first embodiment of FIGS. 2A and 2B to the same or corresponding elements in the second embodiment of FIGS. 7A and 7B.

In the device 1A, the square contact holes 40 are formed in the interlayer dielectric layer 22 right over the respective base regions 16a. The source wiring layer 23 is formed to fill the holes 40, resulting in the layer 23 being contacted with the base regions 16a and the source regions 17. Therefore, the layer 23 is directly contacted with and electrically connected to the regions 16a and 17.

The device 1A of the second embodiment is fabricated in approximately the same way as the device 1 of the first embodiment. Specifically, the contact holes 40, which are sufficiently larger than the contact holes 21, are formed in the step of forming the plugs 18 and 19 shown in FIGS. 6A and 6B. If so, the parts of the tungsten (W) layer (which is used for forming the conductive plugs 18 and 19) existing in the holes 40 are selectively removed in the etch-back process. Thus, the source wiring layer 23 is formed to fill the holes 40 in the step of forming the layer 23.

With the semiconductor device 1A according to the second embodiment of FIGS. 7A and 7B, the conductive plugs 19 are formed to be tilled in the corresponding contact holes 21. The gate wiring layer 24 is electrically connected to the gate connection portion 15b of the gate electrodes 15 by way of the plugs 19.

Accordingly, like the device 1 of the first embodiment, dielectric breakdown of the gate dielectric 13 is prevented or effectively suppressed, which improves the gate withstand voltage of the vertical MOSFETs 31.

Moreover, high-temperature treatment is unnecessary and thus, the MOSFETs 31 can be easily formed to have a shallow structure. As a result, the operation speed of the MOSFETs 31 can be raised.

Furthermore, with the device 1A of the second embodiment, since the contact holes 40 are comparatively large in size, the MOSFETs 31 are difficult to be miniaturized, which is unlike the device 1 of the first embodiment. On the other hand, the surface area of the interlayer dielectric layer 22 over the active region 32 is decreased and therefore, the parasitic capacitance of the MOSFETs 31 can be reduced. Thus, the device 1A of the second embodiment has an additional advantage that the operation speed of the MOSFETs 31 can be raised compared with that of the first embodiment.

Third Embodiment

Figure 8A:
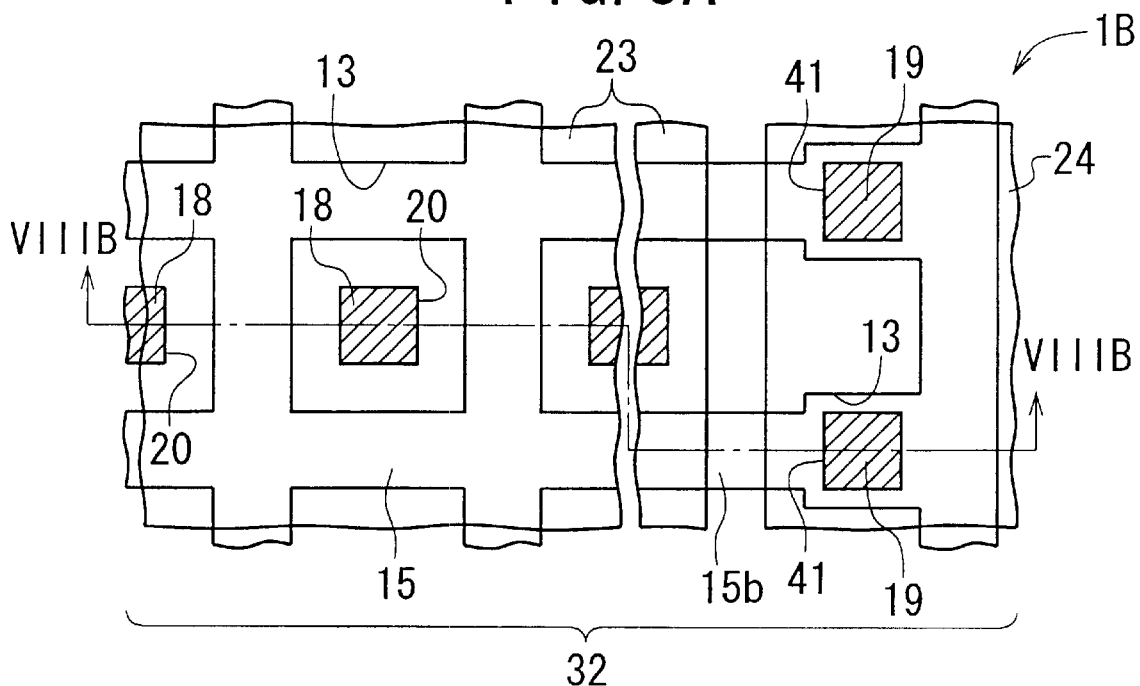
FIG. 8A is a partial plan view showing the layout of a semiconductor device with vertical MOSFETs according to a third embodiment of the invention.
Figure 8B:
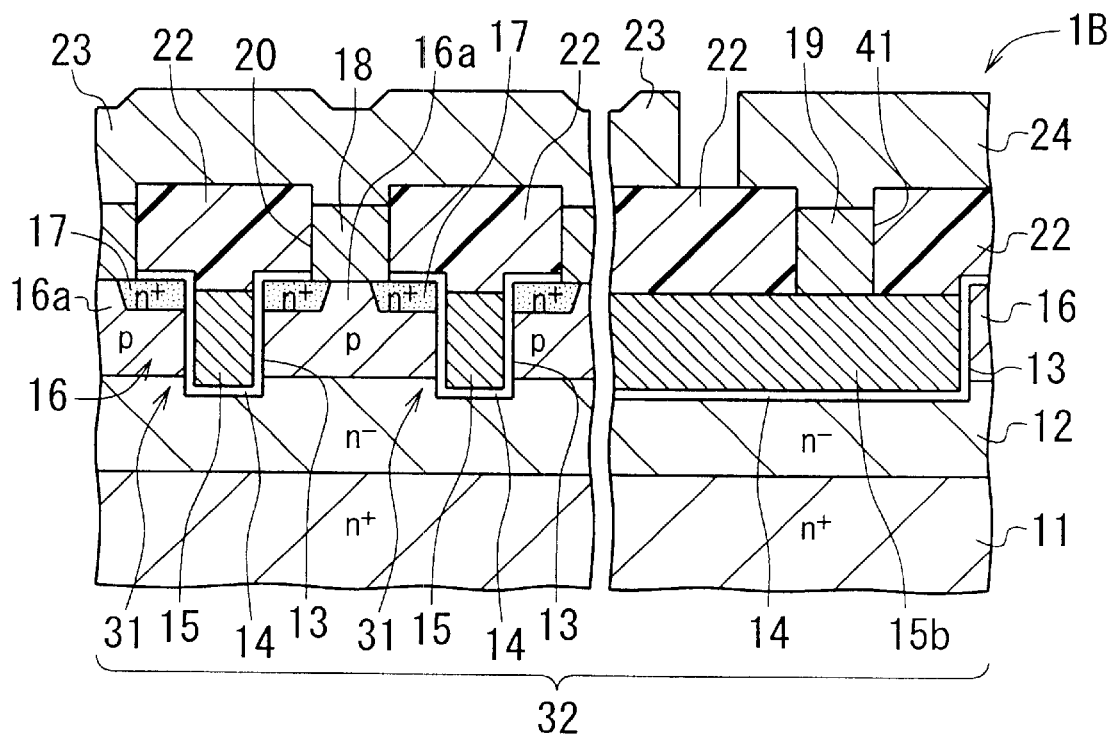
FIG. 8B is a partial, cross-sectional view along the line VIIIB—VIIIB in FIG. 8A, which shows the structure of the device of FIG. 8A.

FIGS. 8A and 8B show the structure of a semiconductor device 1B with vertical MOSFETs 31 according to a third embodiment of the invention, respectively.

The semiconductor device 1B of FIGS. 8A and 8B has the same configuration as the semiconductor device 1 of the first embodiment, except that contact holes 41 equal in size to the contact holes 20 are formed. Therefore, the explanation about the same configuration is omitted here for the sake of simplification by attaching the same reference symbols as used in the first embodiment of FIGS. 2A and 2B to the same or corresponding elements in the third embodiment of FIGS. 8A and 8B.

In the device 1B, the square contact holes 41 are formed in the interlayer dielectric layer 22 right over the gate connection portion 15b of the gate electrodes 15. The size (i.e., width) of the holes 41 is equal to the holes 20. In other words, the holes 20 and 41 are approximately equal in size to the width of the trench 13. The width of the trench 13 and that of the gate connection potion 15b are partially enlarged.

The device 1B of the third embodiment is fabricated in the same way as the device 1 of the first embodiment.

With the semiconductor device 1B according to the third embodiment, the conductive plugs 18 and 19 are filled in the corresponding contact holes 20 and 41, respectively. The source wiring layer 23 is electrically connected to the base regions 16a and the source regions 17 by way of the plugs 18. The gate wiring layer 24 is electrically connected to the gate electrodes 15 by way of the plugs 19 and the gate connection portion 15b.

Accordingly, like the device 1 of the first embodiment, dielectric breakdown of the gate dielectric 13 is prevented or effectively suppressed, which improves the gate withstand voltage of the vertical MOSFETs 31.

Moreover, high-temperature treatment is unnecessary and thus, the MOSFETs 31 can be easily formed to have a shallow structure. As a result, the operation speed of the MOSFETs 31 can be raised.

Additionally, the size of the contact holes 20 can be reduced compared with the prior-art device 100. This is applicable to the contact holes 41. As a result, the MOSFETs 31 can be miniaturized easily.

With the device 1 of the first embodiment, the contact holes 21 need to be designed according to a different design rule from that for the trench 13, because the size of the holes 21 is less than the width of the trench 13. Unlike this, the device 1B of the third embodiment has an additional advantage that the contact holes 20 and 41 can be designed according to the same design rule, because the sizes of the holes 20 and 14 are approximately the same as the width of the trench 13.

Variations

Needless to say, the present invention is not limited to the above-described embodiments. Any change or modification may be added to them within the spirit of the invention.

For example, the n-channel vertical MOSFET 31 is constituted by the n+-type substrate 11, the n−-type epitaxial layer 12, the n-type base region 16a, and the n+-type source region 17 in the above-described embodiments. However, the p-channel vertical MOSFET 31 may be constituted by the p+-type substrate 11, the p−-type epitaxial layer 12, the n-type base region 16a, and the p+-type source region 17.

Although the epitaxial layer 12 formed on the substrate 11 is used, the layer 12 is not always necessary. The base regions 16a may be formed directly on the surface of the substrate 11.

Vertical MOSFETs are formed on the substrate 11 in the above-described embodiments; however, the invention is not limited to this. Any other type of transistors may be formed if it has a vertical FET structure.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A semiconductor device comprising:
   (a) a semiconductor substrate;
   (b) a first semiconductor layer of a first conductivity type formed on the substrate;
      the first semiconductor layer serving as a first source/drain region;
   (c) a second semiconductor layer of a second conductivity type formed on the first semiconductor layer;
      the second semiconductor layer having a trench penetrating the same;
   (d) a gate electrode formed in the trench by way of a gate dielectric;
      the gate electrode having a connection portion located in the trench;
   (e) a second source/drain region of the first conductivity type formed in a surface area of the second semiconductor layer;
   (f) an interlayer dielectric layer formed on the second semiconductor layer to cover the gate electrode;
      the interlayer dielectric layer having a contact hole that exposes the connection portion of the gate electrode;
   (g) a conductive plug filled in the contact hole in such a way as to contact the connection portion of the gate electrode; and
   (h) a wiring layer formed on the interlayer dielectric layer in such a way as to contact the plug;
      the wiring layer being electrically connected to the connection portion of the gate electrode by way of the plug.

2. The device according to claim 1, wherein an active region is formed on the substrate and the second source/drain region is located in the active region;
   and wherein the wiring layer is located to overlap with a periphery of the active region.

3. The device according to claim 1, wherein the trench is formed to have a lattice-like shape and the second semiconductor layer is divided into parts by the trench;
   and wherein the parts of the second semiconductor layer are used to form a plurality of vertical FETs on the substrate.

4. A semiconductor device comprising:
   (a) a semiconductor substrate;
   (b) a first semiconductor layer of a first conductivity type formed on the substrate;
      the first semiconductor layer serving as a first source/drain region;
   (c) a second semiconductor layer of a second conductivity type formed on the first semiconductor layer;
      the second semiconductor layer having a trench penetrating the same;
   (d) a gate electrode formed in the trench by way of a gate dielectric;
      the gate electrode having a connection portion located in the trench;
   (e) a second source/drain region of the first conductivity type formed in a surface area of the second semiconductor layer;

(f) an interlayer dielectric layer formed on the second semiconductor layer to cover the second source/drain region and the gate electrode;
the interlayer dielectric layer having a first contact hole that exposes the connection portion of the gate electrode and a second contact hole that exposes the second source/drain region;
(g) a first conductive plug filled in the first contact hole in such a way as to contact the connection portion of the gate electrode;
(h) a second conductive plug filled in the second contact hole in such a way as to contact the second source/drain region;
(i) a first wiring layer formed on the interlayer dielectric layer in such a way as to contact the first plug;
the first wiring layer being electrically connected to the connection portion of the gate electrode by way of the first plug;
(j) a second wiring layer formed on the interlayer dielectric layer in such a way as to contact the second plug;
the second wiring layer being electrically connected to the second source/drain region by way of the second plug.

5. The device according to claim 4, wherein an active region is formed on the substrate and the second source/drain region is located in the active region;
and wherein the first wiring layer is located to overlap with a periphery of the active region.

6. The device according to claim 1, wherein the trench is formed to have a lattice-like shape and the second semiconductor layer is divided into parts by the trench;
and wherein the parts of the second semiconductor layer are used to form a plurality of vertical FETs on the substrate.

7. The device according to claim 1, wherein each of the first contact hole and the second contact hole has a size approximately equal to a width of the trench.

* * * * *